United States Patent [19]

Nakamura et al.

[11] Patent Number: 4,933,737
[45] Date of Patent: Jun. 12, 1990

[54] POLYSILON CONTACTS TO IC MESAS

[75] Inventors: Tohru Nakamura, Hoya; Takao Miyazaki, Hachioji; Susumu Takahashi, Tokyo; Ichiro Imaizumi, Tokyo; Takahiro Okabe, Tokyo; Minoru Nagata, Kodaira; Masao Kawamura, Fuchu, all of Japan

[73] Assignee: Hitachi, Ltd., Tokyo, Japan

[21] Appl. No.: 56,127

[22] Filed: Jun. 1, 1987

Related U.S. Application Data

[63] Continuation of Ser. No. 443,554, Nov. 22, 1982, abandoned, which is a continuation of Ser. No. 158,366, Jun. 11, 1980, abandoned.

[30] Foreign Application Priority Data

Jun. 18, 1979 [JP] Japan ................................. 54-75715

[51] Int. Cl.$^5$ .......................................... H01L 27/04
[52] U.S. Cl. ..................................... 357/50; 357/23.9; 357/55; 357/59
[58] Field of Search .................. 357/50, 42, 23.7, 23.9, 357/59, 55

[56] References Cited

U.S. PATENT DOCUMENTS

| | | | |
|---|---|---|---|
| 3,570,114 | 3/1971 | Bean | 437/191 |
| 3,600,651 | 8/1971 | Duncan | 357/59 H |
| 3,664,896 | 5/1972 | Duncan | 437/193 |
| 3,740,276 | 6/1973 | Bean | 437/157 |
| 3,764,413 | 10/1973 | Kakizaki et al. | 357/59 K |
| 4,157,269 | 6/1979 | Ning et al. | 357/59 H |
| 4,157,269 | 6/1979 | Ning | 437/69 |
| 4,396,933 | 8/1983 | Magdo | 357/59 H |
| 4,499,657 | 2/1985 | Ooga et al. | 357/59 H |
| 4,546,538 | 10/1985 | Suzuki | 437/79 |
| 4,782,030 | 11/1988 | Katsumota | 357/34 |

FOREIGN PATENT DOCUMENTS 1764313 5/1972 Fed. Rep. of Germany .
2818090 11/1978 Fed. Rep. of Germany .

OTHER PUBLICATIONS

Wieder, IBM Tech. Discl. Bull., vol. 21, No. 8, Jan. 1979, pp. 3166–3169.
IEEE Trans. on Ports Hybrids & Packaging, vol. PHP10, No. 4, Dec. 1974, pp. 221–229.
Davies et al., IEEE J. of Solid State Circuits, vol. SC 12, No. 4, Aug. 1977, pp. 367–375.
Appels et al., "Local Oxidation of Silicon . . . ", Philips Research Reports, vol. 25, pp. 118–132, (1970).
Chang, IBM Tech. Discl. Bulletin, vol. 21, No. 7, Dec. 1978, pp. 2761–2762.

*Primary Examiner*—William D. Larkins
*Attorney, Agent, or Firm*—Antonelli, Terry, Stout & Kraus

[57] ABSTRACT

A bipolar transistor comprises an n-type Si semiconductor body having a convex portion, an insulation film covering the surface of the semiconductor body other than the convex portion, and a p-type polycrystalline Si layer formed on the insulation film. A p-type region formed in the convex portion serves as an intrinsic base region, the polycrystalline Si layer serves as an extrinsic base region, an n-type region formed in the intrinsic base region serves as an emitter region, and the body serves as a collector region.

7 Claims, 10 Drawing Sheets

POLYSILON CONTACTS TO IC MESAS

This is continuation of application Ser. No. 443,554 filed Nov. 22, 1982 now abandoned, which is a continuation of application Ser. No. 158,366 filed June 11, 1980, now abandoned.

BACKGROUND OF THE INVENTION

1. Field of the Invention

This invention relates to a high switching speed transistor, and more particularly to a semi-conductor device structure for bipolar transistors, field effect transistors, integrated injection logic circuits and the like.

2. Description of the Prior Art

A semiconductor device shown in sectional view in FIG. 1A is a conventional bipolar transistor which has been used in a semiconductor integrated circuit (IC, LSI).

In the conventional bipolar transistor, e.g. an NPN transistor, a base region 14 of p conductivity type formed in a Si epitaxially grown layer 13 of n conductivity type which is formed on a Si substrate 11 of p conductivity type and an n-type emitter region 15 is formed in the base region 14. In FIG. 1A, numerals 12 and 12' denote an n+-type buried layer and an n+-type contact region for a collector electrode, respectively, and numeral 16 denotes a p-type isolation region for isolating adjacent elements. In the structure of the prior art device, all regions are formed by pn junctions irrespective of active regions or non-active regions of the transistor. Accordingly, it has the following disadvantages;

(i) Since a capacitance between the non-active region in the base region and the collector region is large, power dissipation is high. This is disadvantageous for a high speed operation.

(ii) Since the base region 14, the emitter region 15, the n+-type diffusion region 12' and the isolation region 16 are formed by photoetching processes separately, a designer must take margin for alignment of respective photomasks into consideration. This results in large gate areas.

The problem (i) discussed above is particularly serious.

Generally, switching speed and power dissipation which are basic factors to indicate the performance of the integrated circuit depend on a magnitude of current in the transistor included and an electrostatic capacitance of the elements, including parasitic elements, which are to be charged and discharged by that current. Since the electric power required to operate the transistor at a given magnitude of current is proportional to that capacitance value, it is preferable that the capacitance value is as small as possible. For a given sheet resistance, a time constant of the transistor is also proportional to the capacitance value. Accordingly, the reduction of the capacitance value must be considered to increase the switching speed of the transistor.

FIG. 1B shows a structure, in sectional view, of a prior art insulated-gate field effect transistor (MOS FET). In the conventiona n-channel MOS FET, n-type regions 102 and 103 which are to function as a source region and a drain region, respectively, are formed in a p-type substrate 101, and a gate electrode 104 is formed on a gate insulating film 105. Numeral 106 denotes selectively formed device isolating insulating films. In this device structure, source and drain electrodes S and D must be taken out through holes (contact holes) smaller than the source and drain regions 102 and 103, respectively. As a result, the souce and drain regions are to be at least larger than the contact holes and hence parasitic capacitances $C_{DS}$ and $C_{SS}$ between the source and drain regions and the substrate 101 are large enought to be innegligible. FIG. IC shows an equivalent circuit for the MOS FET having the parasitic capacitances $C_{DS}$ and $C_{SS}$. Since the switching speed of the MOS FET depends on charge-discharge time for the capacitance $C_{DS}$ and the gate capacitance of the succeeding stage MOS FET, a high speed operation is attainable by reducing the parasitic capacitance $C_{DS}$.

SUMMARY OF THE INVENTION

It is an object of the present invention to provide a semiconductor device such as bipolar transistor or MOS FET, which overcomes the disadvantages of the prior art semiconductor devices as discussed above and has reduced parasitic capacitances, a high switching speed and a small power dissipation.

In order to achieve the above object, in accordance with the semiconductor device of the present invention, a polycrystalline semiconductor layer is formed on an insulating film which is formed on a single crystal semiconductor body (including a substrate, an epitaxial layer on the substrate and a diffusion layer in the substrate), and an extrinsic base region (contact region for a base electrode) of a bipolar transistor or parasitic drain and source regions (contact regions for drain and source electrodes) of a MOS FET are formed using the polycrystalline semiconductor layer Thus, in the bipolar transistor, the parasitic base capacitance is reduced, and in the MOS FET the parasitic capacitances between the drain and source regions and the substrate are reduced.

DETAILED DESCRIPTION OF THE PREFERRED EMBODIMENTS

Hereunder, the present invention will be described in detail in connection with the preferred embodiments thereof:

Embodiment 1

Figure 1A:
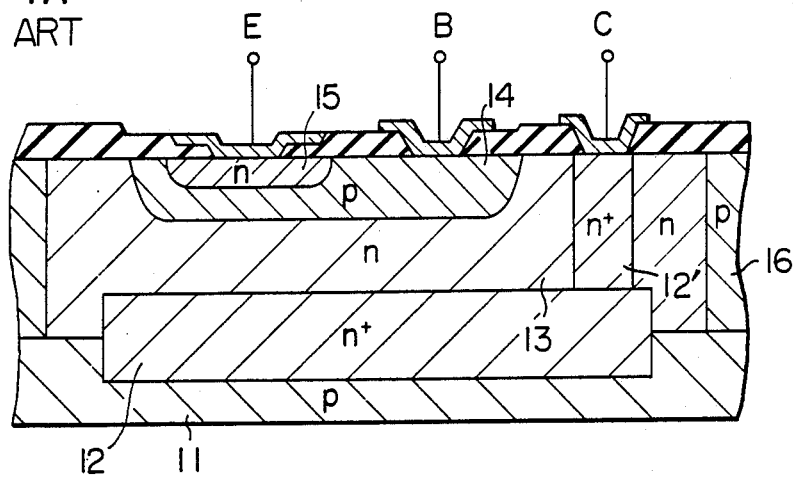
FIG. 1A is a sectional view showing a structure of a prior art bipolar transistor.
Figure 1B:
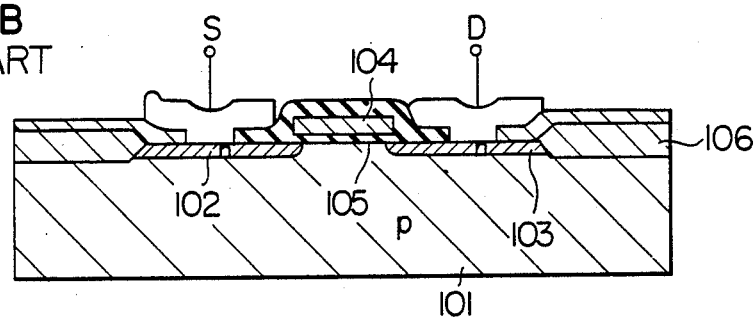
FIG. 1B is a sectional view showing a structure of a prior art insulated gate field effect transistor (IGFET).
Figure 1C:
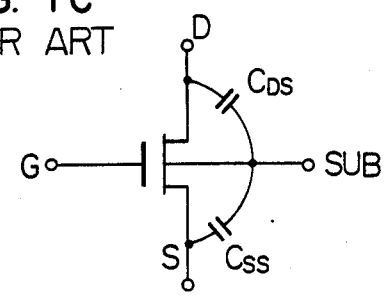
FIG. 1C shows an equivalent circuit diagram illustrating parasitic capacitances of the prior art IGFET.
Figure 2A:
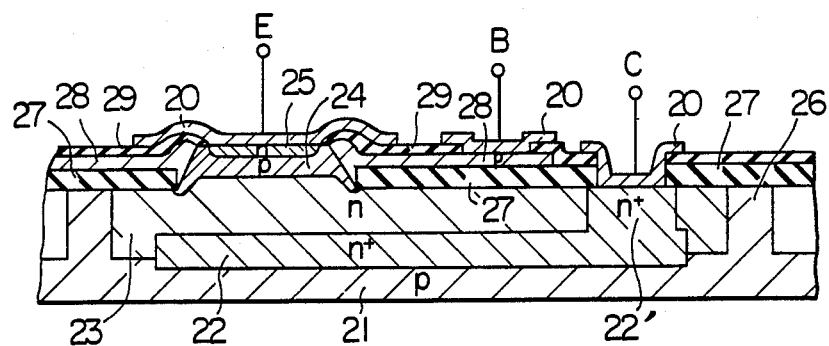
FIGS. 2A and 2B are sectional views showing structures of bipolar transistors in accordance with a first embodiment of the semiconductor device of the present invention.

Referring to FIG. 2A, a device structure of a first embodiment of the present invention is shown. It shows a sectional view of a structure of a bipolar transistor in accordance with the present invention.

The bipolar transistor shown in FIG. 2A uses a polycrystalline silicon layer 28 to form an extrinsic base region on an insulating layer 27 in order to overcome the problem (i) of the prior art device discussed above, and the self-alignment process is adopted to form base and emitter regions in order to overcome the problem (ii) discussed above. The device of the present invention attains the high speed operation and the microminiaturization by forming the active region of the transistor in convex shape. When the structure shown in an npn transistor, numerals 21, 22, 22′, 23 and 26 denote a p-type Si substrate, n+buried layer, n+-type region, n-type Si epitaxially grown layer (with 22, 22′ and 23 forming a collector region) and p-type isolation region, respectively, and numerals 24, 25, 27, 28, 29 and 20 denote a p-type base region, n-type emitter region, insulating layer (such as $SiO_2$ layer), p-type extrinsic base region with polycrystalline Si, inter-insulation layer (such as $SiO_2$ layer) and electrodes (E: emitter, B: base and C: collector), respectively.

FIGS. 3A, 3B, 3C and 3D show a manufacturing process for the semiconductor device of the present embodiment, and they show the structures before made into the structure shown in the sectional view of FIG. 2A. The manufacturing process is now explained in the sequence of the drawings.

Figure 3A:
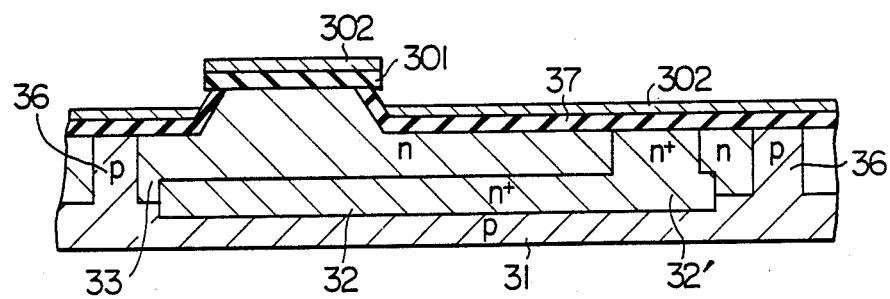
FIGS. 3A, 3B, 3C and 3D are sectional views of the structures showing an example of a manufacturing process, in the order of process, for the bipolar transistor shown in FIG. 2A.

FIG. 3A; An n+buried layer 32 is formed by diffusion on a p-type Si substrate 31, an n-type Si epitaxial layer 33 is grown, a p-type isolation region 36 is formed, an insulating film other than silicon dioxide film, e.g. silicon nitride film is deposited over the entire surface, and the insulating film is selectively etched to leave the silicon nitride film 301 only in the area corresponding to the active region of the transistor. The silicon epitaxial layer is then etched using the film 301 as a mask to form the active region into a convex shape. In the etching step, the silicon layer is deeply etched from the edge of the mask 301 toward the inside of the silicon layer. Then, an oxide film 37 is formed by thermal oxidation and then a metal layer 302 such as Al is deposited. The oxide film portion formed under the mask 301 is prevented from being covered with the metal layer 302.

Figure 3B:
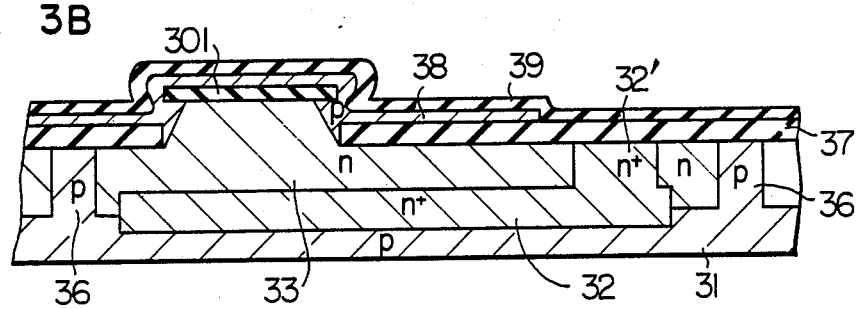

FIG. 3B: The oxide film portion not covered by the metal layer 302 under the mask 301 is removed by etching, and the metal mask 302 is removed, and a polycrystalline Si layer is formed on the entire surface. P-type impurities are then diffused and patterned to form an extrinsic base region 38. At this stage, only the side of convex epitaxial layer contacts with the polycrystalline Si layer. Instead of depositing the polycrystalline layer on the entire surface, the silicon layer 38 may be formed by a selective epitaxial growth process. In this case, patterning of the polycrystalline Si layer is not necessary. Then, a $SiO_2$ film 39 is deposited as an inter-insulation layer.

Figure 3C:
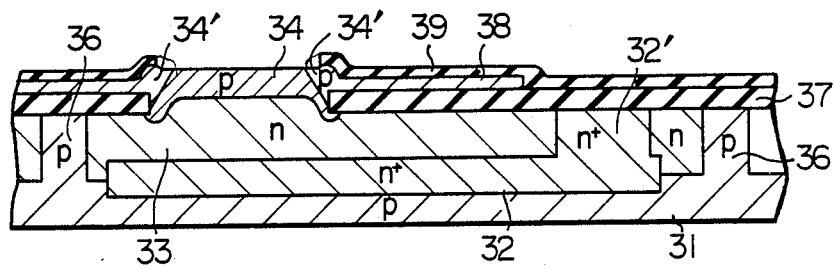

FIG. 3C: The nitride film 301, the polycrystalline crystalline Si layer 38 and the oxide film 39 on the active region are removed by lift-off technique, and p-type impurities are diffused to form an intrinsic base region 34. Then, thermal oxidation is carried out to oxidize the top of the extrinsic base region 34′.

Figure 3D:
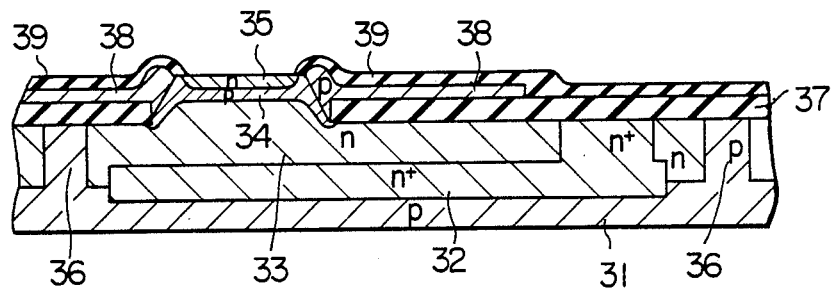

FIG. 3D: An n-type emitter region 35 is formed. Thereafter, contact holes for the collector region and the base region are formed and electrodes are deposited to complete the device as shown in FIG. 2A.

Figure 2B:
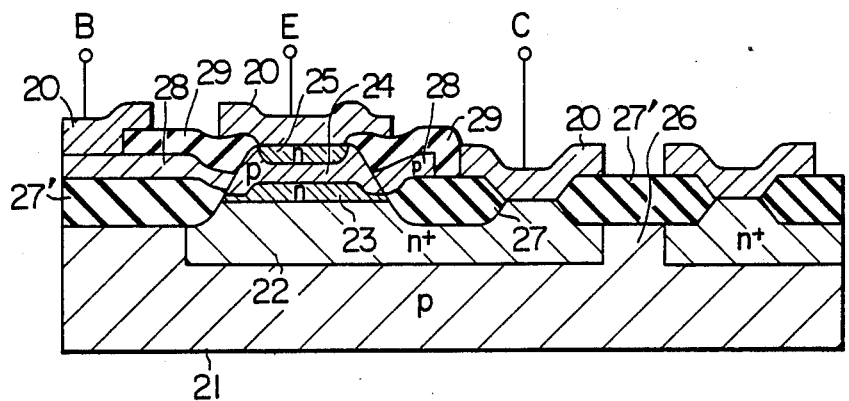

In FIG. 2A, by forming an n+-type burried layer immediately below the convex portion of the n-type Si epitaxial layer, a bipolar transistor structure as shown in FIG. 2B is provided. This device can be readily fabricated by reducing the thickness of the epitaxial layer, deeply etching the epitaxial layer in the formation of the convex portion, and increasing the thickness of the n+burried layer (i.e. increasing the amount of up-diffusion). Numeral 27′ denotes a thick insulation film for isolating elements.

Embodiment 2

Figure 4:
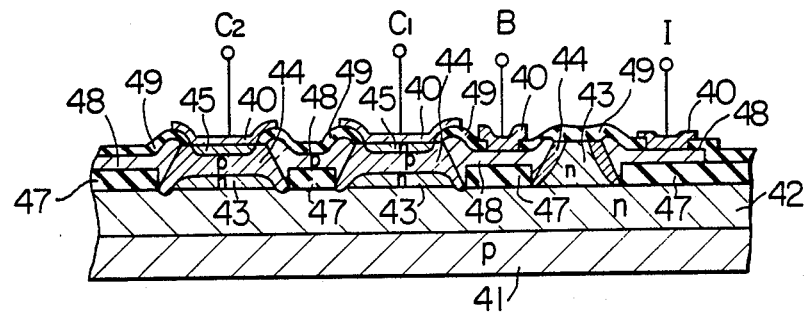
FIG. 4 is a sectional view showing a structure of an integrated injection logic circuit in accordance with a second embodiment of the semiconductor device of the present invention.

FIG. 4 shows an embodiment in which the device structure of the present invention is applied to an integrated injection logic circuit (IIL). The IIL shown can be readily fabricated by using the epitaxial layer 23 and the region 25 shown in FIG. 2A as the emitter and the collector, respectively, In FIG. 4, numeral 41 denotes a p-type Si substrate, 42 an n-type buried layer, 43 an n-type Si epitaxial layer, 44 a p-type region formed in the epitaxial layer 43, 45 an n-type region, 47 an insulation film, 48 a polycrystalline Si layer (p-type), 49 an inter-isolation film, 40 an electrode, I an injector terminal, B a base terminal and $C_1$ and $C_2$ collector terminals.

Embodiment 3

FIGS. 5A, 5B, 5C, 5D, 5E and 5F show another manufacturing process for fabricating the device structure of the present invention.

Figure 5A:
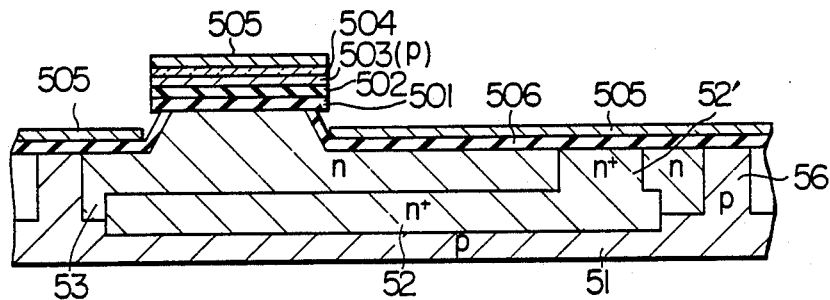
FIGS. 5A, 5B, 5C, 5D, 5E and 5F are sectional views of the structures showing an example of a manufacturing process, in the order of process, for a bipolar transistor in accordance eith a third embodiment of the semiconductor device of the present invention.

FIG. 5A: An $n^+$-type burried layer 52 is formed on a p-type Si substrate 51, an n-type Si epitaxial layer 53 is grown and a p-type isolation region 56 is formed. On the epitaxial layer, a silicon dioxide film 501, a silicon nitride film 502, a polycrystalline Si layer 503 of low resistivity (either of p-type or of n-type with phosphorus being highly doped), and a highly doped glass (e.g. phosphosilicate glass) 504 are deposited. They are patterned as shown by photoetching. Using this multi-layer film as a mask, the silicon epitaxial layer is etched into a convex shape. It is then thermally oxidized at a high temperature to form an oxide film 506, on which a metal film such as Al is deposited under a high vacuum to form a layer 505. The layer 505 is not deposited on an overhang region of the multilayer film.

Figure 5B:
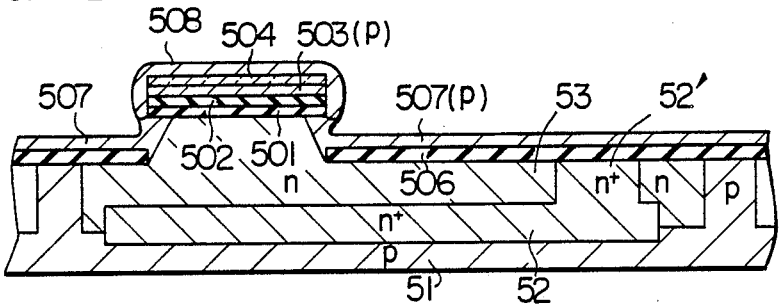

FIG. 5B: Etching is carried out using the metal layer 505 as a mask to remove the oxide film on the side of the convex portion. Thereafter, the layer 505 is removed and a polycrystalline silicon layer 507 of high resistivity is deposited on the entire surface. It is then processed at a high temperature so that only the region 508 (mainly on the top and the side of the concave portion) in the polycrystalline layer 507 diffused from the films 503 and 504 of the multilayer film provides a low resistivity. Then, only the region 508 is removed by etchant (e.g. mixture of HF, $HNO_3$ and $CH_3COOH$).

Figure 5C:
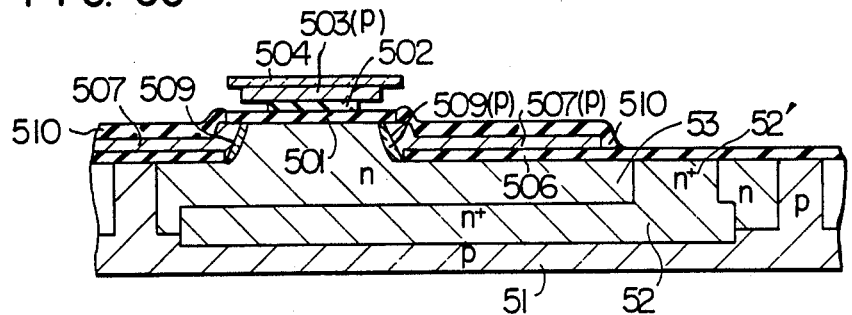

FIG. 5C: The side of the silicon nitride film 502 is etched. Then, p-type impurities are diffused into the polycrystalline silicon layer 507, and a p-type base region 509 is formed on the side of the convex portion. Therafter, an inter-isolation layer 510 is formed.

Figure 5D:
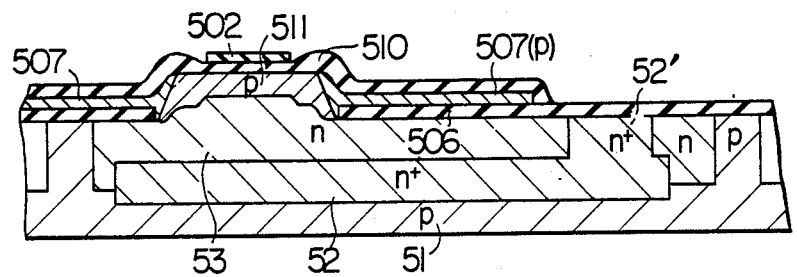

FIG. 5D: Using the layer 510 as a mask, the highly doped glass layer 504 and the low resistance polycrystalline layer 503 are removed. Then, thermal oxidation is carried out to thicken the inter-insulation layer 510. P-type impurities are ion-implanted on the entire surface to form a base region 511.

Figure 5E:
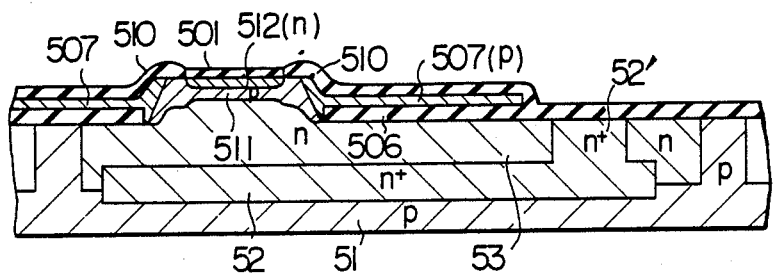

FIG. 5E: The silicon nitride film 502 is removed and n-type impurities are ion-implanted to form an emitter region 512.

Figure 5F:
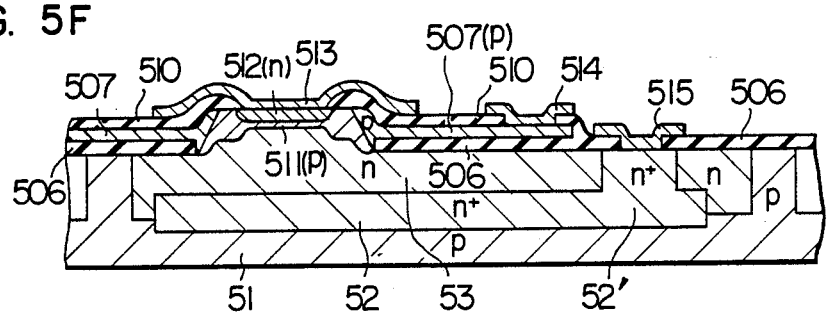

FIG. 5F: The oxide film 501 is removed and portions of the oxide films 506 and 510 are removed. Electrodes 513, 514 and 515 are formed. The electrode 513 is used as an emitter electrode, 514 is used as a base electrode and 515 is used as a collector electrode to complete the bipolar transistor of the present invention.

The embodiments 1, 2 and 3 described above have the following features:

(i) The convex portion is formed in the silicon epitaxial layer by etching and the extrinsic base region is formed on the insulation film on the side of the convex portion. As a result, the base-to-collector capacitance is reduced and the high speed operation is attained.

(ii) The intrinsic base and the emitter are formed in the concave portion by self-alignment technique (i.e. providing substantially constant spacing between the edges of the emitter and the edges of the intrinsic base).

(iii) The base-to-emitter breakdown voltage is raised by thickening the thermal oxidation film at the region 34' shown in FIG. 3C.

In the device of the present invention, the same operation is attained when the conductivity types, that is, p-type and n-type, are reversed. The interisolation layer (such as 36 in FIG. 3A) may be implemented by the insulation film.

Embodiment 4

Figure 6:
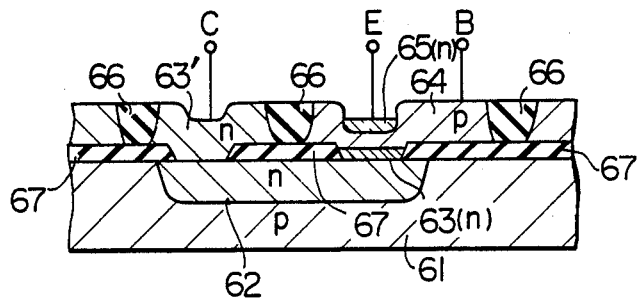
FIG. 6 is a sectional view showing a structure of a bipolar transistor in accordance with a fourth embodiment of the semiconductor device of the present invention.
Figure 7A:
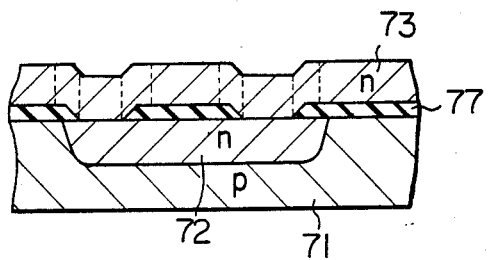
FIGS. 7A, 7B, 7C and 7D are sectional views of the structures showing an example of a manufacturing process, in the order of process, for the bipolar transistor shown in FIG. 6.
Figure 7B:
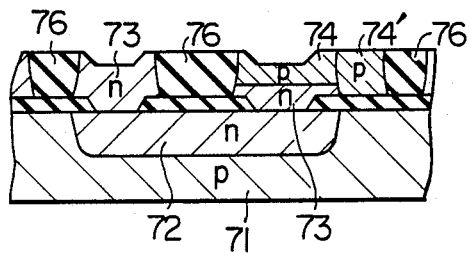
Figure 7C:
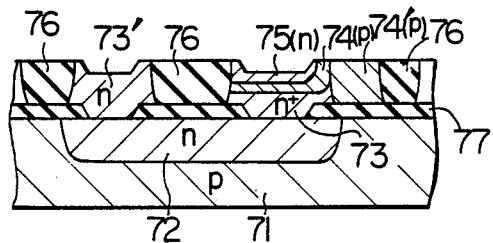
Figure 7D:
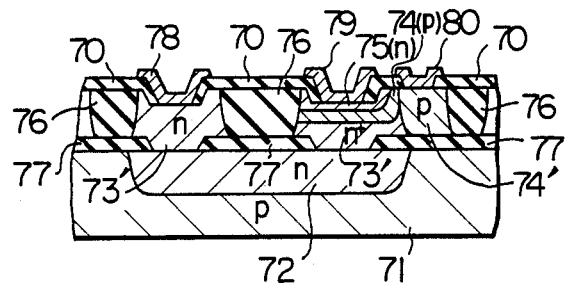

FIG. 6 shows a sectional view of a structure of a bipolar transistor in accordance with a fourth embodiment of the semiconductor device of the present invention. An n-type buried layer 62 is formed on a p-type Si substrate 61, and an insulation film 67 (e.g. $SiO_2$) having openings is formed on the layer 62. A polycrystalline silicon layer and a single crystal silicon layer are formed on the layers 67 and 62, respectively, to form a bipolar transistor having the n-type single crystal Si layers 63, 63' and the n-type buried layer 62 as a collector region, the p-type region 64 formed in the signle crystal silicon layer 63, as a base region, and the n-type region 65 formed in the base region as an emitter region. A region 66 is an isolation region formed by partially oxidizing the polycrystalline silicon layer. The bipolar transistor of the present embodiment has much smaller base-to-collector capacitance than the prior art device because the extrinsic base region (polycrystalline silicon layer) is formed on the insulation film 67. A manufacturing process for the transistor of the present embodiment is shown in FIGS. 7A, 7B, 7C and 7D. An n-type layer 72 is formed in a p-type Si substrate 71. An insulation film, e.g. silicon dioxide film 77 is formed on the surface of the substrate and openings are formed therein. Then, an n-type epitaxial layer 73 is formed on the entire surface of the substrate (FIG. 7A). In this step, a polycrystalline silicon layer is deposited on the oxide film 77 and a single crystal silicon layer is deposited on the exposed areas of the substrate. By selectively setting the condition of epitaxial growth, the film thicknesses of the polycrystalline layer and the single crystal layer can be controlled to flatten the surface. Then, a portion of the silicon deposited layer 73 is oxidized to form an isolation region 76. The isolation region may be formed by a pn junction. Thereafter, an extrinsic base region (p-type highly doped region) 74' for reducing a base resistance and an intrinsic base region (p-type region) 74 are formed. (FIG. 7B.) Then, an emitter region (n-type region) 75 is formed. If a highly doped n-type region is simultaneously formed in a collector contact region 73', a conventional transistor is fabricated, and if the $n^+$ region 73 is not formed, a Schottky transistor is fabricated. (FIG. 7C.) Then, a passivation film 70 is formed and electrodes 78, 79 and 80 are formed to complete the bipolar transistor of the present invention. When the silicon layer is not deposited on the entire surface of the insulation film 77 during the epitaxial growth, or when the silicon layer on the insulation film 77 is subsequently removed by etching, the isolation region 76 is not required.

Figure 8:
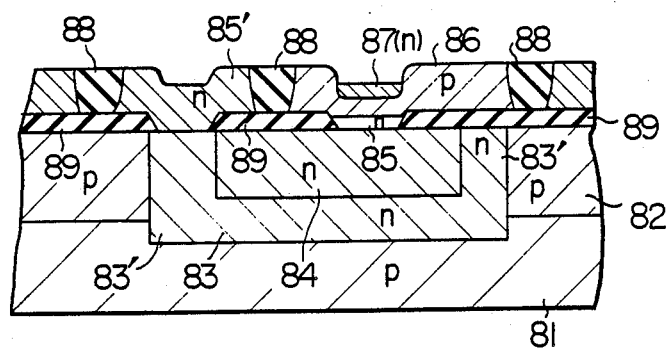
FIG. 8 is a sectional view showing a structure of a high breakdown voltage bipolar transistor in accordance with a fifth embodiment of the semiconductor device of the present invention.
Figure 9:
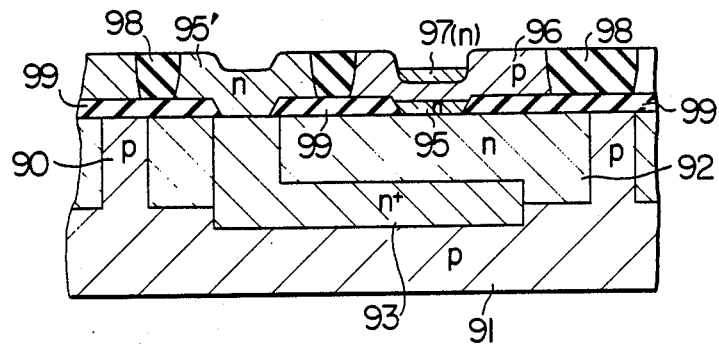
FIG. 9 is a sectional view showing a structure of a high breakdown voltage bipolar transistor in accordance with a sixth embodiment of the present invention.

FIGS. 8 and 9 show embodiments of device structures of high breakdown voltage bipolar transistors in accordance with the semiconductor device of the present invention.

Embodiment 5 (FIG. 8)

A p-type Si epitaxial layer 82 is formed on a p-type Si substrate 81. An n-type buried layer 83 and an n-type region 83' isolate a collector region 84 from adjacent elements. The collector region 84 is a lightly doped n-type region. An insulation film 89 having openings is formed on epitaxial layers 84, 83' and 82, and an n-type Si epitaxial layer is deposited. A p-type region 86 formed in the n-type Si epitaxial layer is used as a base and an n-type region 87 formed in the base region is used as an emitter, and the n-type regions 83', 83, 84, 85, 85' and used as collector to complete an npn transistor. Unlike the device structure shown in FIG. 6, this structure has an increased breakdown voltage because of the thick collector region. Numeral 88 denotes an isolation region formed by an oxide film.

Embodiment 6

A high breakdown transistor may also be fabricated by using an n-type Si epitaxial layer. FIG. 9 shows a sectional view thereof. An n-type Si layer 92 is an epitaxial layer grown on a p-type Si substrate 91. Numeral 93 denotes an n+-type buried layer. In the present device structure, a p-type isolation region 90 for isolating from adjacent elements is required. The manufacturing process after an insulation film 99 has been formed is similar to that of FIG. 8. Numerals 92, 93, 95 and 95' denote n-type collector regions, numeral 96 denotes a p-type base region, numeral 97 denotes an n-type emitter region and numeral 98 denotes an oxide film isolation region.

Embodiment 7

Figure 10:
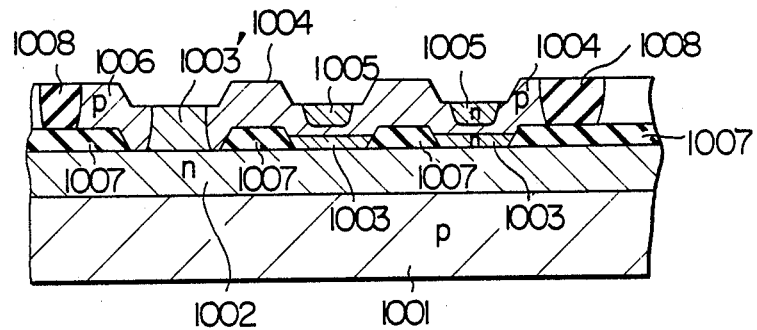
FIG. 10 is a sectional view showing a structure of an integrated injection logic circuit in accordance with a seventh embodiment of the present invention.

FIG. 10 shows an embodiment in which the device structure of the semiconductor device of the present invention is applied to an IIL circuit (integrated injection logic circuit). An insulation film 1007 having openings is formed on an n-type buried layer 1002 formed in a p-type Si substrate 1001, and an n-type Si epitaxial layer is deposited thereon. A portion of the n-type Si layer is oxidized to form an isolation region 1008. P-type impurities are diffused in regions 1006 and 1004 to form an injection region and a base region. An n-type region 1005 is formed in the base region 1004 to form a collector region of an npn inverse transistor to complete the IIL circuit having an extrinsic base region of the npn transistor formed on the oxide film. numeral 1003' denotes a base region of a lateral pnp transistor and numeral 1003 denotes an n-type region. The IIL circuit thus formed has the following features:

(i) Since the extrinsic base region does not directly contact with the emitter region, a ratio of the collector area to the base area is large and an inverse mode current amplification factor is large.

(ii) Since the extrinsic base region is on the oxide film, a base-to-emitter capacitance is small and a high speed operation is attainable.

Embodiment 8

Figure 11:
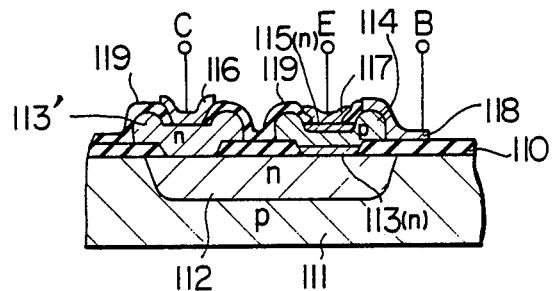
FIG. 11 is a sectional view showing a structure of a bipolar transistor fabricated by a selective epitaxial growth method, in accordance with an eighth embodiment of the semiconductor device of the present invention.

FIG. 11 shows an embodiment of a bipolar transistor structure in which a Si layer on an insulation film 110 having openings is formed by selective epitaxial technique. The manufacturing process is similar to that of FIG. 7. In the present device, since a single crystal Si layer is formed on the insulation film, crystal defects in the deposited layer are few, and a high density of integration is attained because the isolation region is formed simultaneously with the epitaxial growth. Numerals 111 and 112 denote p-type Si substrate and n-type buried layer, respectively, numerals 110 and 119 denote insulation films, numerals 113', 112 and 113 denote collector regions, numerals 114 and 115 denote a base region and an emitter region, respectively, and numerals 116, 117 and 118 denote electrodes for the respective regions.

According to the Embodiments 4, 5, 6, 7 and 8 described above, a high switching speed transistor can be fabricated because of reduced base capacitance, and a high breakdown voltage transistor and a high switching speed IIL circuit can be fabricated in the same chip.

A feature of the embodiments described above resides in the device structure which enables a high speed operation of the transistor, the device structure being fabricated by forming the oxide film having openings on the substrate, depositing the semiconductor layer thereon by conventional or selective epitaxial technique, and forming the base region therein.

In the embodiments described above, a similar operation is attainable by reversing the p-type layer and the n-type layer. When the epitaxial layer on the insulation film is of p-type conductivity, the base diffusion step may be omitted.

Embodiment 9

Figure 12A:
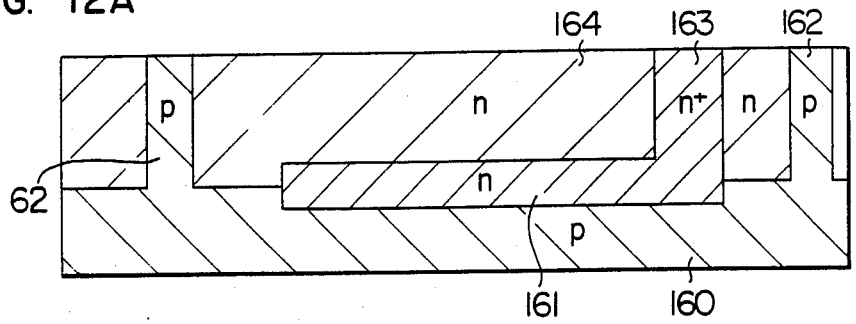
FIGS. 12A, 12B and 12C are sectional views of the structures showing an example of a manufacturing process, in the order of process, for a bipolar transistor in accordance with a ninth embodiment of the semiconductor device of the present invention.

In FIG. 12A, an n-type buried layer 161 is formed on the p-type semiconductor (e.g. Si) substrate 160, and an n-type epitaxial layer 164 is formed. Then, a p-type isolation region 162 and a highly doped n+-type diffusion region 163 are formed. The isolation region 162 may be formed by diffusion from the surface of the epitaxially grown layer, or it may be formed by an up-diffusion technique in which p-type impurities are buried before the epitaxial growth. The isolation region may be formed by a thin oxide film using isoplanar technique (FIG. 12D).

Figure 12B:
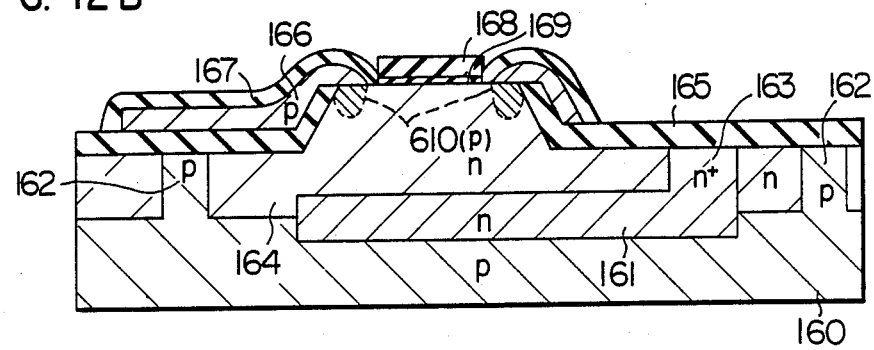

After the structure shown in FIG. 12A has been formed, a convex portion is formed by etching, and a polycrystalline Si layer is formed to fabricate a structure shown in FIG. 12B.

In FIG. 12B, numerals 168 and 169 denote nitride film and oxide film, respectively, numerals 165 and 167 denote thermal oxidation films, numeral 166 denotes a p-type polycrystalline Si layer, and numeral 610 denotes a portion of a p-type base region formed in the epitaxial layer by the diffusion from the layer 166.

The nitride film 168 and the oxide film 169 are then removed and impurities are doped by diffusion or ion implantation through the opening to form a p-type base region 611. Then, n-type impurities are doped through the same opening to form an emitter region 612. Then, openings are formed in the oxide films 165 and 167 and electrodes 613, 614 and 615 are formed, which are used as emitter, base and collector electrodes, respectively (FIG. 12C).

Embodiment 10

Figure 12C:
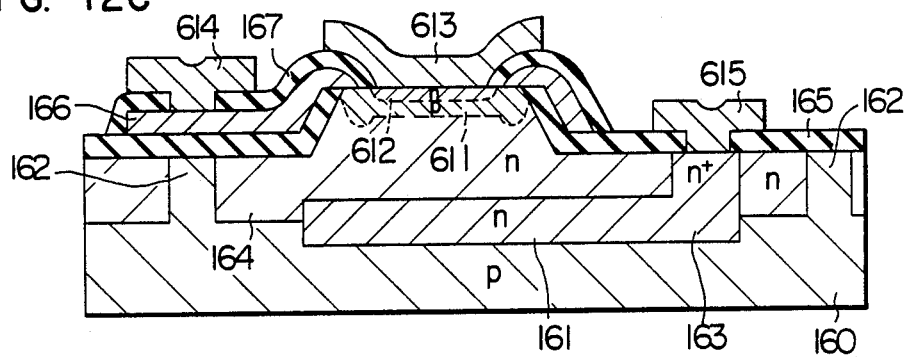
Figure 13:
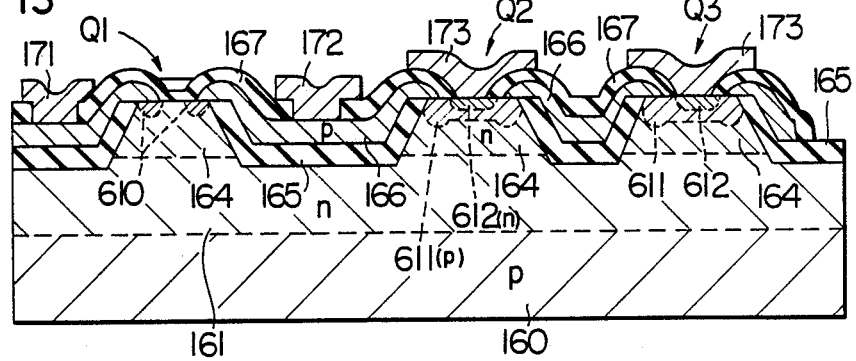
FIG. 13 is a sectional view showing a structure of an integrated injection logic circuit in accordance with a tenth embodiment of the semiconductor device of the present invention.

An embodiment in which the device structure shown in FIGS. 12A to 12C is applied to an integrated injection logic (IIL) circuit is described below. FIG. 13 shows a sectional view of a structure of a 2-collector IIL in accordance with the present invention. The manufacturing process is substantially the same as that of the Embodiment 9. An n-type burried layer 161 is formed on a p-type semiconductor (e.g. Si) substrate 160, and an n-type epitaxial layer 164 is grown. Thereafter, an etching mask is deposited on an area $Q_1$ where a lateral pnp transistor is to be fabricated and areas $Q_2$ and $Q_3$ where an npn transistor is to be fabricated. Then, the epitaxial layer is selectively etched, oxidized, and a Si layer is deposited and oxidized to complete the IIL. Numerals 165 and 167 denote insulation films (e.g. $SiO_2$), numeral 166 denotes a p-type polycrystalline Si layer, numeral 610 denotes emitter and collector regions of the lateral pnp transistor, numerals 611 and 612 denote base and emitter regions of the npn transistor, and numerals 171, 172 and 173 denote injector electrode, base electrode and collector electrode, respectively.

Embodiment 11

FIGS. 14A, 14B, 14C, 14D and 14E show an embodiment of an insulated gate field effect transistor in accordance with the structure of the present invention. The manufacturing process is now explained with reference to the drawings. An n-channel MOS FET is illustrated.

Figure 14A:
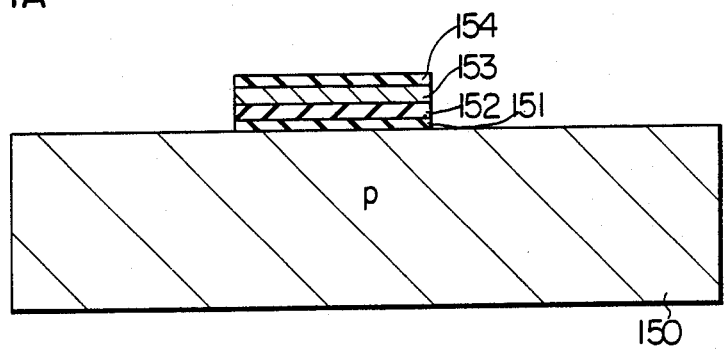
FIGS. 14A, 14B, 14C, 14D and 14E are sectional views of the structures showing an example of a manufacturing process, in the order of process, for an insulated gate field effect transistor in accordance with an eleventh embodiment of the semiconductor device of the present invention.

A multilayer film comprising an oxide film (e.g. SiO$_2$) 151, a nitride film (e.g. Si$_3$N$_4$) 152, a highly doped Si layer 153 and a nitride film 154 is formed on a p-type semiconductor (Si) substrate 150, and it is patterned as shown (FIG. 14A).

Figure 14B:
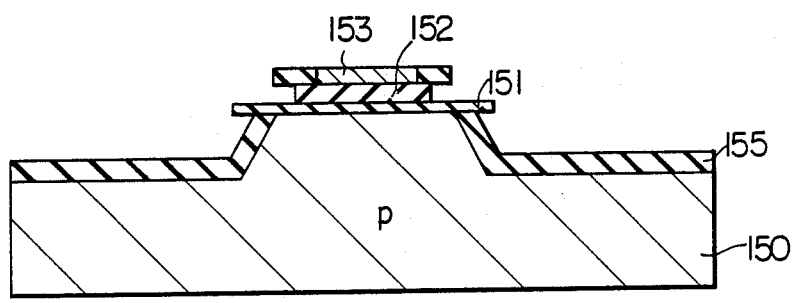

Using the multilayer film as a mask, the substrate 150 is etched. Thereafter, an oxide film (e.g. SiO$_2$) 155 is formed, the nitride film 154 is removed and the nitride film 152 is side-etched (FIG. 14B).

Figure 14C:
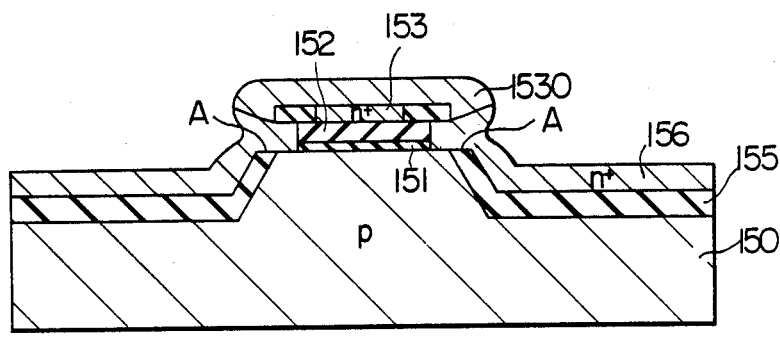

Using the nitride film 152 as a mask, the oxide film 151 is etched to expose the silicon substrate surface indicated by A in FIG. 14C. Then, a polycrystalline Si layer 156 of low impurity concentration is deposited. The polycrystalline Si layer 156 is formed to cover the area A on the Si substrate surface. Then, thermal oxidation process is carried out to diffuse the impurities in the Si layer 153 into the Si layer 156 to expand the highly doped region to a region 1530 (FIG. 14C).

Figure 14D:
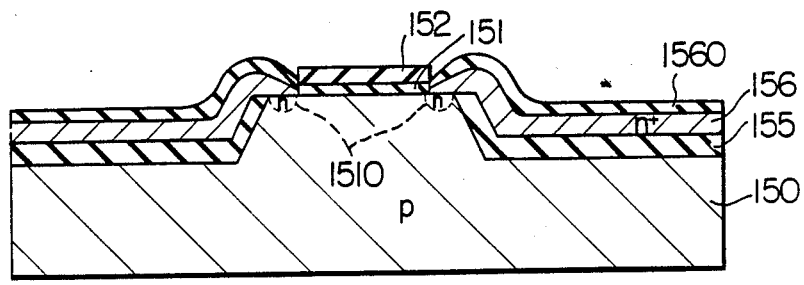
Figure 14E:
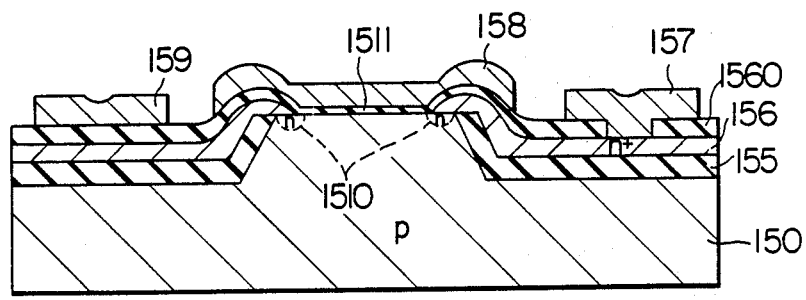

The silicon layers 153 and 1530 on the highly doped region are removed by silicon etchant e.g. mixture of HF and HNO$_3$, to expose the nitride film 152. Thereafter, impurities are diffused into the silicon layer 156 to form an n-type region. Since the impurities are diffused into the substrate from the area A through the silicon layer 156, an n-type source/drain region 1510 is formed. The surface of the Si layer 156 is then oxidized to form an oxide film 1560. (FIG. 14D: same structure as FIG. 12B).

The nitride film 152 and the oxide film 151 are removed, and a gate insulation film (e.g. SiO$_2$) 1511 is formed between the source and drain. Openings are formed in the oxide film 1560 and source, drain and gate electrodes 157, 159 and 158 are formed. In the present embodiment, patterning of the multilayer film, the silicon layer 156 and the electrodes 157, 158 and 159 is necessary.

As described above, since the source and drain regions of the MOS FET are formed on the oxide film in accordance with the present embodiment, the capacitances of the respective regions are reduced.

Figure 15:
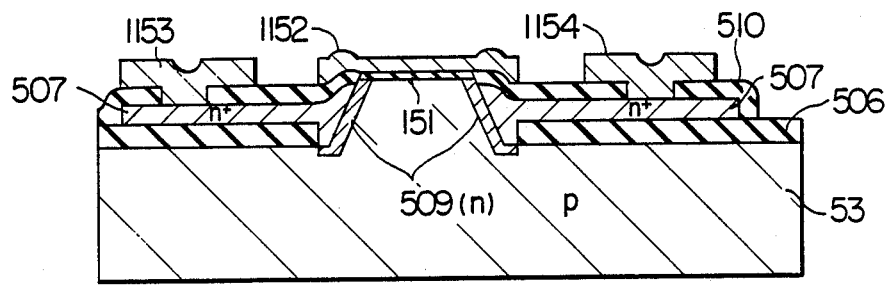
FIG. 15 is a sectional view showing a structure of an insulated gate field effect transistor in accordance with a twelveth embodiment of the semiconductor device of the present invention.

Instead of diffusing the base and emitter regions in FIG. 5C, a gate insulation film and a gate electrode may be formed to complete a MOS FET shown in FIG. 15, in which numeral 509 denotes source/drain regions, numeral 507 denotes source/drain contact areas, numeral 151 denotes a gate insulation film, numeral 1152 denotes a gate electrode and numerals 1153 and 1154 denote source and drain electrodes.

In FIG. 15, if the gate electrode 1152 is absent, a lateral pnp transistor is provided.

As described hereinabove, the present invention enables the realization of the transistors and the integrated circuits having the completely different structure than the prior art devices, high operation speed, high integration density, low cost and high breakdown voltage. The present invention also provides a basic technology for realizing various transistors.

While silicon is used as the semiconductor in the embodiments described above, other semiconductor such as GaAs may be used to attain the device of the present invention. It should be understood that the p-type and n-type may be reversed in the respective embodiments.

What is claimed is:

1. A semiconductor device comprising:
   a single crystalline semiconductor body;
   a plurality of protruding portions and hollow portions of said body formed by removing predetermined unnecessary portions of said body, said hollow portions being adjacent to said protruding portions and being lower than upper surfaces of said protruding portions, wherein said upper surfaces of said protruding portions each have upper peripheral edge portions;
   a first insulating film extending from a predetermined location on a surface of said hollow portion towards said upper surface of at least one of said protruding portions along a side surface of at least one of said protruding portions;
   a first region of first conductivity type formed in said at least one of said protruding portions;
   a second region of second conductivity type opposite to said first conductivity type formed on said first region;
   a third region of said second conductivity type formed under said first region;
   a polycrystalline semiconductor film of said first conductivity type formed on a surface of said first insulating film and extending along said surface of said first insulating film from a predetermined location over said hollow portion between said adjacent protruding portions and over said side surface of said protruding portion to contact at least a predetermined part of said upper surface of said protruding portion, and polycrystalline semiconductor film being formed after said protruding portions, said hollow portions and said first insulating film have been formed; and
   a second insulating film formed on said polycrystalline semiconductor film, said polycrystalline semiconductor film being connected to said first region at said predetermined part of said upper surface of said protruding portion, wherein said second region is formed in self-alignment with said upper peripheral edge portion of said protruding portion to be spaced from the upper peripheral edge portion by a substantially constant distance, and further wherein said first and third regions have the widths in a lateral direction substantially the same as those of regions of said protruding portions in which said first and third regions are formed, respectively.

2. A semiconductor device according to claim 1, wherein a junction between said first and third region is formed in said protruding region at a level which is higher than a level of said hollow portion and the width of said junction in a lateral direction is self-aligned with the width of said protruding portion in said lateral direction.

3. A semiconductor device according to claim 1, wherein the thickness of said polycrystalline semiconductor film in said hollow portion is less than the height of said protruding portion.

4. A semiconductor device according to claim 1, wherein said polycrystalline semiconductor film is contacted to said second region with a substantially constant width.

5. The semiconductor device according to claim 1, wherein the thickness of said first insulating film under said polycrystalline semiconductor film in said hollow portion is smaller than the height of said protruding portion.

6. A semiconductor device according to claim 1, wherein a distance between an electrode formed on said second region and said upper peripheral portion of said protruding portion is substantially the same as the total thickness of said polycrystalline semiconductor film and said second insulating film in a lateral direction at said upper surface of said protruding portion.

7. A semiconductor device according to claim 1, wherein the width of said first region is self-aligned to that of said protruding portion.

* * * * *